(12) United States Patent
Dietrich et al.

(10) Patent No.: US 7,423,242 B2
(45) Date of Patent: Sep. 9, 2008

(54) OVEN FOR NON-METAL MELTING

(75) Inventors: Marc Dietrich, Grossschirma (DE); Bernhard Freudenberg, Coburg (DE); Armin Müller, Freiberg (DE); Jens Seidel, Freiberg (DE); Josef Stenzenberger, Freiberg (DE)

(73) Assignee: Deutsche Solar AG, Freiberg (DE)

( * ) Notice: Subject to any disclaimer, the term of this patent is extended or adjusted under 35 U.S.C. 154(b) by 23 days.

(21) Appl. No.: 11/740,620

(22) Filed: Apr. 26, 2007

(65) Prior Publication Data

US 2007/0251937 A1 Nov. 1, 2007

(30) Foreign Application Priority Data

Apr. 27, 2006 (DE) ............... 10 2006 020 234

(51) Int. Cl.
*F27B 14/00* (2006.01)
*H05B 3/62* (2006.01)

(52) U.S. Cl. ............... 219/420; 219/422; 219/424; 219/426; 219/539; 219/541; 219/552; 219/553; 373/117; 373/118; 373/128; 373/129; 373/134; 117/217; 117/222

(58) Field of Classification Search ......... 219/420–426, 219/539, 541, 552–3; 373/117–8, 128–9, 373/134; 117/217, 222
See application file for complete search history.

(56) References Cited

U.S. PATENT DOCUMENTS

| 2005/0087125 | A1 | 4/2005 | Muhe et al. |
| 2005/0275144 | A1 | 12/2005 | Muhe et al. |

FOREIGN PATENT DOCUMENTS

| DE | 32 01 181 C2 | 7/1983 |
| DE | 10339402 | 4/2005 |
| DE | 103 49 339 A1 | 6/2005 |
| EP | 1072696 | 1/2001 |
| GB | 156 133 | 2/1922 |
| JP | 7 49185 | 2/1995 |
| JP | 2002-243370 | 8/2002 |

*Primary Examiner*—Shawntina Fuqua
(74) *Attorney, Agent, or Firm*—McGlew and Tuttle, P.C.

(57) ABSTRACT

Oven for non-metal melting, in particular silicon melting, with a housing enclosing an interior, at least one mould arranged in the interior for receiving a non-metal melt, at least one electrical heating device enclosing, at least partially, the at least one mould for influencing the temperature of the non-metal melt, and a power supply device connected in an electrically conductive manner to the at least one heating device for providing the heating device with a time-variable current I(t), wherein the current I(t) has a frequency of 0.1 Hz to 1000 Hz and the current I(t) is of a magnitude sufficient for setting a predetermined temperature of the non-metal melt, the currents in the plurality, where necessary, of heaters having a defined phase position in respect of one another.

16 Claims, 7 Drawing Sheets

OVEN FOR NON-METAL MELTING

BACKGROUND OF THE INVENTION

1. Field of the Invention

The invention relates to an oven for non-metal melting, a method for operating said oven and non-metal blocks produced by the method.

2. Background Art

A crystal growing unit is known from DE 103 49 339 A1. This has a round mould which is encompassed by a cylindrical coil mantle. This oven generates silicon worthy of improvement in a number of respects.

SUMMARY OF THE INVENTION

The problem of the invention is to create an oven for non-metal melting which can generate non-metal blocks which are as suitable as possible for further processing.

The object is solved by an oven for non-metal melting with a housing enclosing an interior, at least one mould arranged in the interior for receiving a non-metal melt, at least one electrical heating device enclosing at least partially the at least one mould for influencing the temperature of the non-metal melt, and a power supply device coupled in an electrically conductive manner to the at least one heating device for supplying the heating device with a time-variable current I(t), wherein the current I(t) has a frequency of 0.1 Hz to 1000 Hz and the current I(t) is of a magnitude suitable for setting a predetermined temperature of the non-metal melt. The object is also solved by a method for at least one of melting non-metals and solidifying non-metal melts comprising the following steps: providing an oven according to any one of the preceding claims, applying a time-variable current I(t), generating a time-variable magnetic field in the non-metal melt. The crux of the invention consists in using the lines which in any case are present in an electrical heating device to generate a time-variable magnetic field in the non-metal melt. To do this, a time-variable current must be applied to the lines. Convections arise in the non-metal melt by means of the time-variable magnetic field which even out the distribution of foreign atoms.

Additional features and details of the invention result from the description of a plurality of embodiments by reference to the drawings.

DESCRIPTION OF THE PREFERRED EMBODIMENTS

Figure 1:
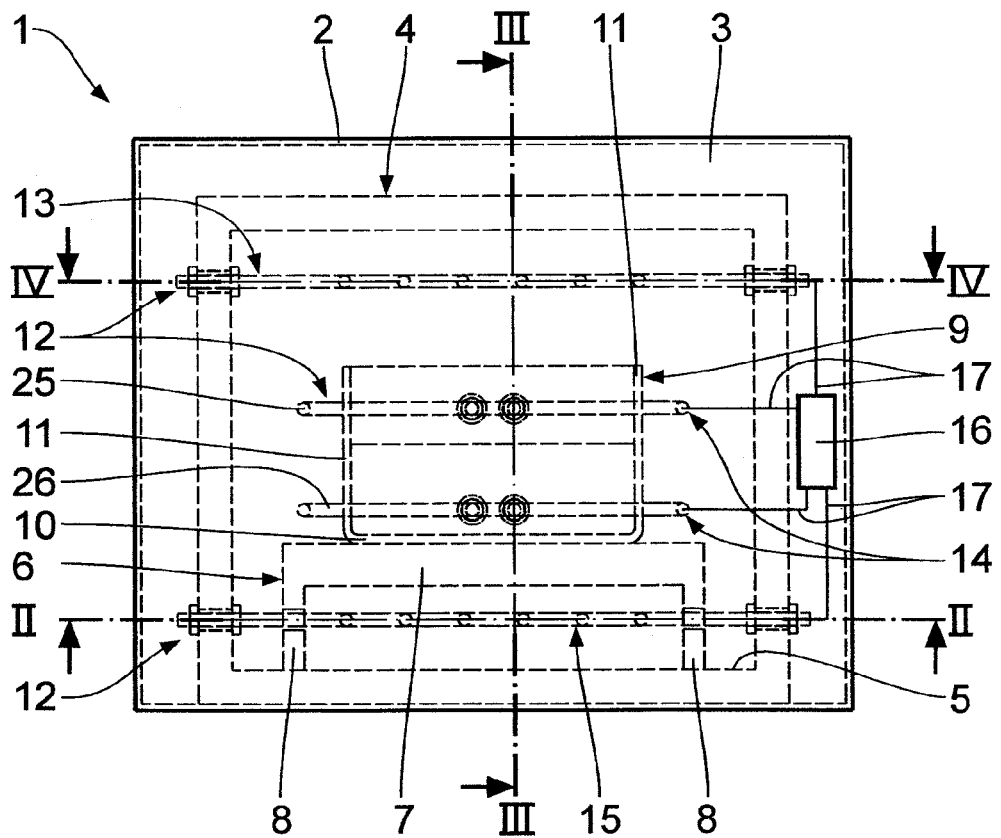
FIG. 1 shows a view of an oven according to a first embodiment.

Referring to FIGS. 1 to 4, a first embodiment of the invention is described below. An oven 1 serves for the melting and/or targeted solidification of non-metals, and silicon in particular. This means that raw silicon melted in the oven 1 as well as silicon which is already melted outside the oven can be cooled in a controlled manner. The oven 1 has a substantially cuboidal housing 2 which is a steel boiler in design. Housing 2 is a pressure vessel which is evacuated during operation of oven 1 in order to prevent impurities of the silicon melt 24 resulting from oxygen and other gases. The housing 2 encloses a housing interior 3. A cuboidal graphite insulation 4 is arranged in the interior 3. Inside the graphite insulation 4 there is arranged a support 6 supported on the floor 5 of the insulation 4. Said support 6 has a horizontal supporting plate 7 as well as side walls 8 projecting downwards therefrom supported on the floor 5. At least one cuboidal mould 9 which is rectangular in cross-section is supported on the supporting plate 7, said mould 9 having a mould floor 10 as well as four side walls 11 in parallel pairs extending upwards from the floor 10. A plurality of moulds 9, for example two, four, six or eight moulds, may be arranged in the oven 1. The advantage of moulds 9 which are rectangular in cross-section is that a plurality of moulds can be arranged adjacent to one another, thus saving space, and more effectively than is possible when using round moulds, for example. Depending on the operating state of the oven 1, the mould 9 is filled with silicon to be melted, already melted silicon 24 or solidified silicon melt. The term "mould" denotes both a container designed for one use, which subsequently destroys itself or is destroyed; it also denotes a container which may be used several times, frequently also referred to as a crucible.

The oven 1 has an electric heating device 12 consisting of an overhead heating device 13 disposed above the mould 9, a side heating device 14 encompassing the mould 9 on the circumferential face and a floor heating device 15 disposed below the mould 9, not all the devices 13, 14, 15 needing to be present simultaneously. The heating device 12 encompasses the mould 9 at least partially, i.e. it is arranged at least above it and/or below it and/or laterally to the mould 9. The devices 13, 14 and 15 are connected to a power supply device 16, shown only in FIG. 1 and only shown schematically therein, via electrical feed lines 17. The overhead heating device 13 has two mutually separate lines 18, 19 which are led from outside through a side wall 20 of the graphite insulation 4 and are led outside again through the opposing side wall 21 of the graphite insulation 4. The lines 18, 19 are connected to the power supply device 16 at both ends, being electrically conductive. When "lines" are mentioned in the patent application, this refers to those which are suitable for carrying the corresponding heating currents. As these currents can amount to several thousand amperes, these lines as a rule comprise solid strips or rods which preferably consist of a highly electrically conductive material. The actual heating lines preferably contain carbon and/or molybdenum and/or tungsten. The feed portions in the cooler region may contain copper and/or aluminium and/or carbon-based materials. The lines 18, 19 each have feed portions 22 running through the side walls 20, 21 as well as interposed looped portions 23. The looped portions 23 are arranged mirror-symmetrically to one another. The loops of the looped portions 23 run horizontally. The floor heating device 15 arranged below the mould 9 running through the support 6 in the present case is similar in design to the overhead heating device 13.

The side heating device 14 has two superposed line loops 25, 26 encompassing the mould 9 on the circumferential face.

Figure 2:
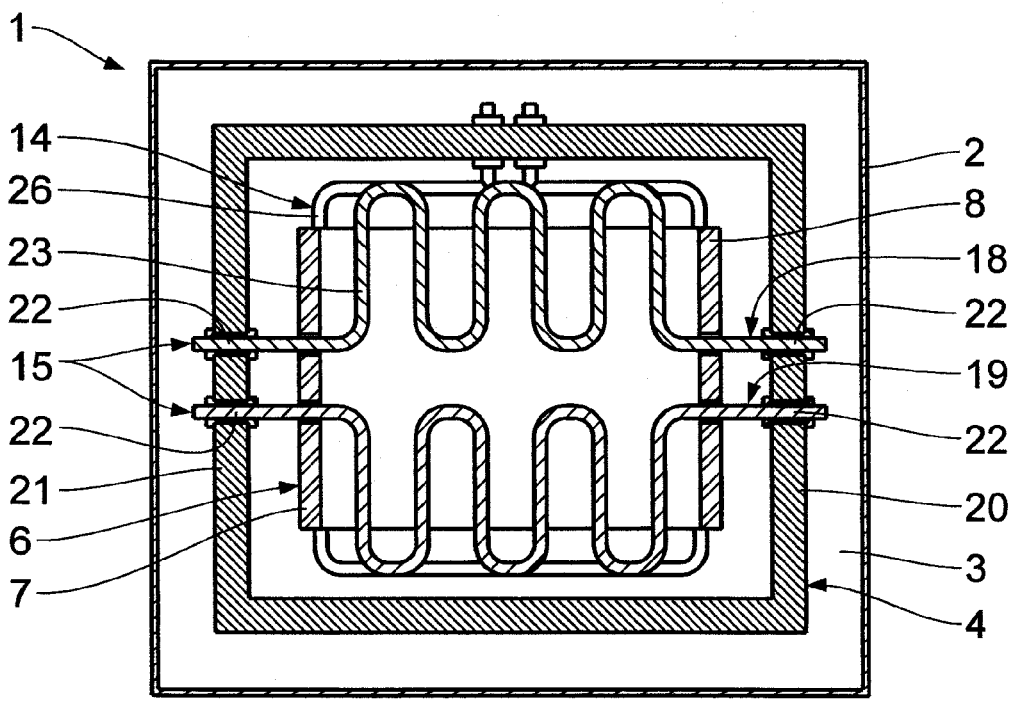
FIG. 2 shows a section according to the line II-II in FIG. 1.
Figure 3:
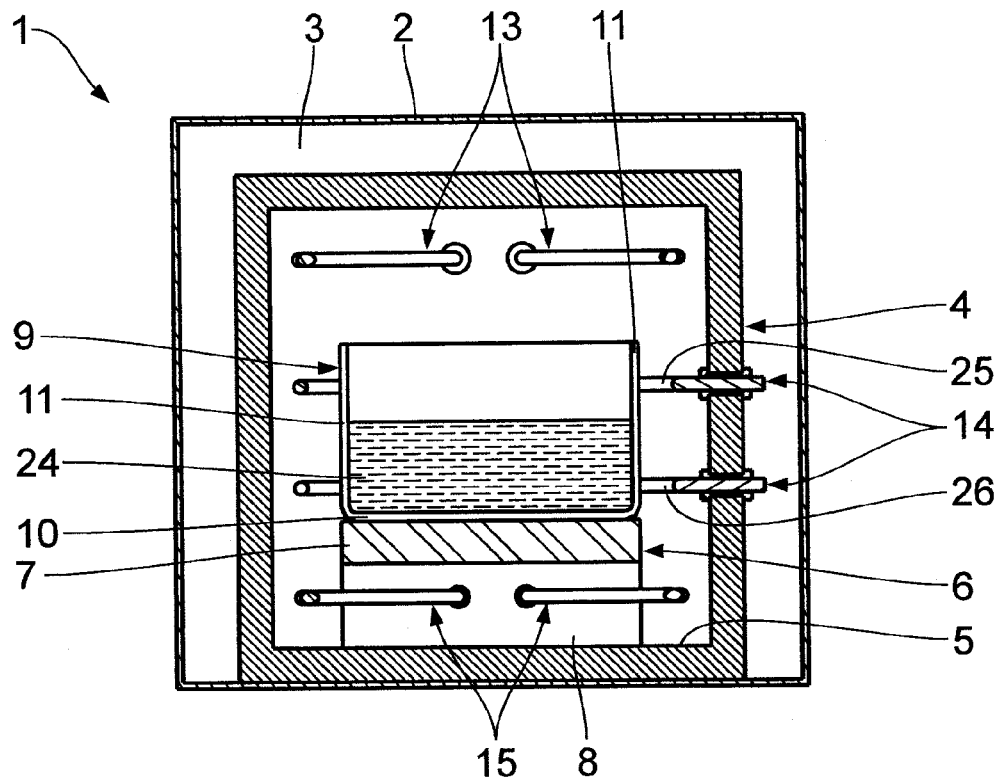
FIG. 3 shows a section according to the line III-III in FIG. 1.
Figure 4:
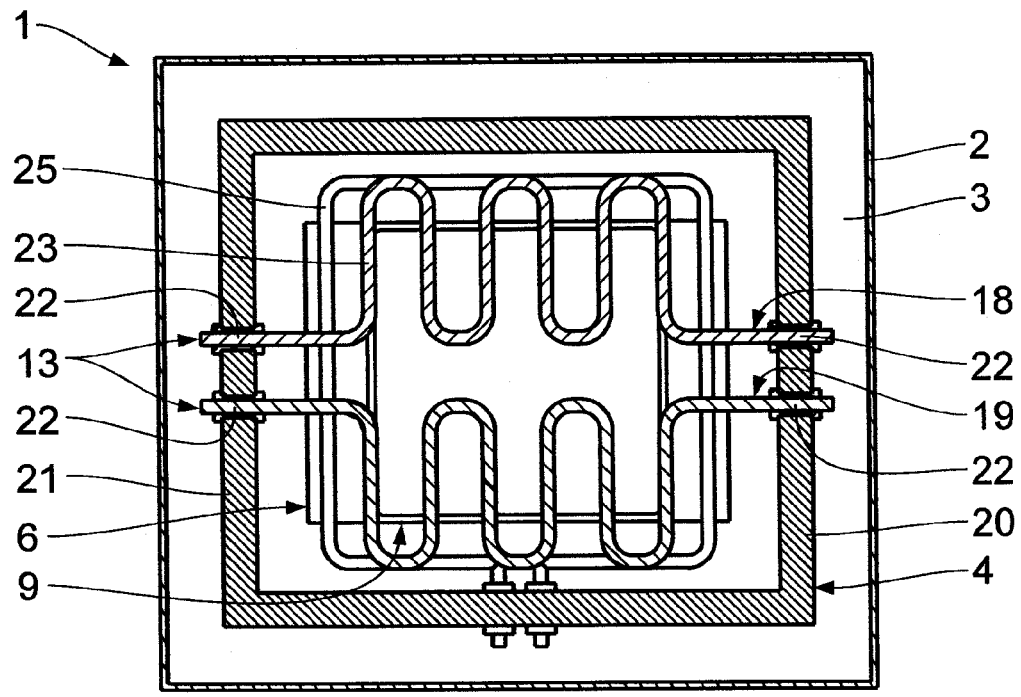
FIG. 4 shows a section according to the line IV-IV in FIG. 1.

The loops 25, 26 substantially follow the rectangular outer contour of the mould 9 and to this extent, apart from the feed portions 22, are substantially rectangular. The feed portions of the floor heating device 15 or over-head heating device 13 led through the graphite insulation 4 on the one hand, and of the side heating device 14 are displaced at 90° from one another with respect to a vertical axis, as shown in FIG. 2.

The manner in which the oven is operated is described below. The mould 9 is filled with silicon. The interior of the oven 1 is evacuated. The interior can also be filled with an inert gas, for example argon. The power supply device 16 supplies the heating device 12 with electrical current I(t). The time-variable current I(t) may preferably consist of a direct current component $I_{DC}$ and an alternating current component $I_{AC}(t)$, so that the following applies: $I(t)=I_{DC}+I_{AC}(t)$. The alternating current component $I_{AC}(t)$ may comprise a normal sinusoidal alternating current. It is also possible for there to be other time-variable currents, for example sawtooth or rectangular current. The alternating current component $I_{AC}(t)$ has a frequency of 0.1 Hz to 1000 Hz, in particular 1 to 500 Hz, in particular 10 to 300 Hz, in particular 75 Hz to 250 Hz. It is also possible to operate at approx. 50 Hz. The alternating current portion $I_{AC}(t)$ lies approximately between 100 and 5000 ampere-turns. The direct current portion $I_{DC}$ may lie between 0 and 5000 ampere-turns. The current portions are referred to in units of "ampere-turn", this actually being a unit of the magnetomotive force generated by a current of 1 ampere in a single conductor loop. In the case of a plurality of conductor loops, the current is multiplied by the number of turns. Specifying the "ampere-turns" is more meaningful than specifying the currents in the individual loops because ultimately the number of conductor loops—in the case of the side heating device 14, for example—may be freely selected. The various heating devices 13, 14 and 15 can all be operated in phase or with a corresponding phase shift, in particular of 60° or 120°. Travelling fields can also be generated with the various heating devices 13, 14 and 15.

In the present embodiment, the phase shift amounts to 0° between the two loops 25, 26. The phase shift of the current through the floor heating device 15 and overhead heating device 13 on the one hand and the side heating device 14 on the other hand amounts to +60°. The actual frequency used is 50 Hz. The phase shift 4 between a comparison current $I_V(t)$ and a reference current $I_B(t)$ is defined as follows: assuming the reference current can be represented as $I_B(t)=I_{B0} \sin(2 \pi f t)$, then the comparison current has a phase shift φ, where it can be represented as $I_V(t)=I_{V0} \sin(2 \pi f t + 2\pi\phi/360°)$. Here, f represents the frequency and φ the phase shift.

It is shown below by reference to an illustration how the alternating current portion $I_{AC}(t)$ enhances the quality of the polycrystalline silicon (mc-Si) blocks.

| | | | | |
|---|---|---|---|---|
| Proportion of AC in the total current in % | 0% | 50% | 50% | 100% |
| Frequency of the AC in Hz | — | 8 Hz | 17 Hz | 50 Hz |
| Amperage through overhead heating device in A | 800 | 1000-1100 | 1000-1100 | 800-900 |
| Total amperage through side heating device in ampere-turns | 800 | 1500-1600 | 1500-1600 | 1000-1100 |
| Amperage through floor heating device in A | 0 | 130-270 | 130-270 | 0-200 |
| Indication of the yield of good material from the mc-Si blocks (the higher the figure the greater the yield) | 1 | 2 | 2 | 3 |

By applying a time-variable current to the heating device 12, time-variable magnetic fields are generated in the silicon melt 24 which lead to increased convection of the melt 24. By this means it is possible to achieve a more homogeneous mixing of the melt 24 and therefore reduced inclusions of foreign atoms in the polycrystalline silicon. The heating device 12 may also have lines for heating purposes—hot during operation—for heating the melt, for example through direct current, and additional lines—cold during operation—for generating the travelling magnetic field. In this case, the electrical heating and generation of the magnetic fields would be decoupled from one another.

Figure 5:
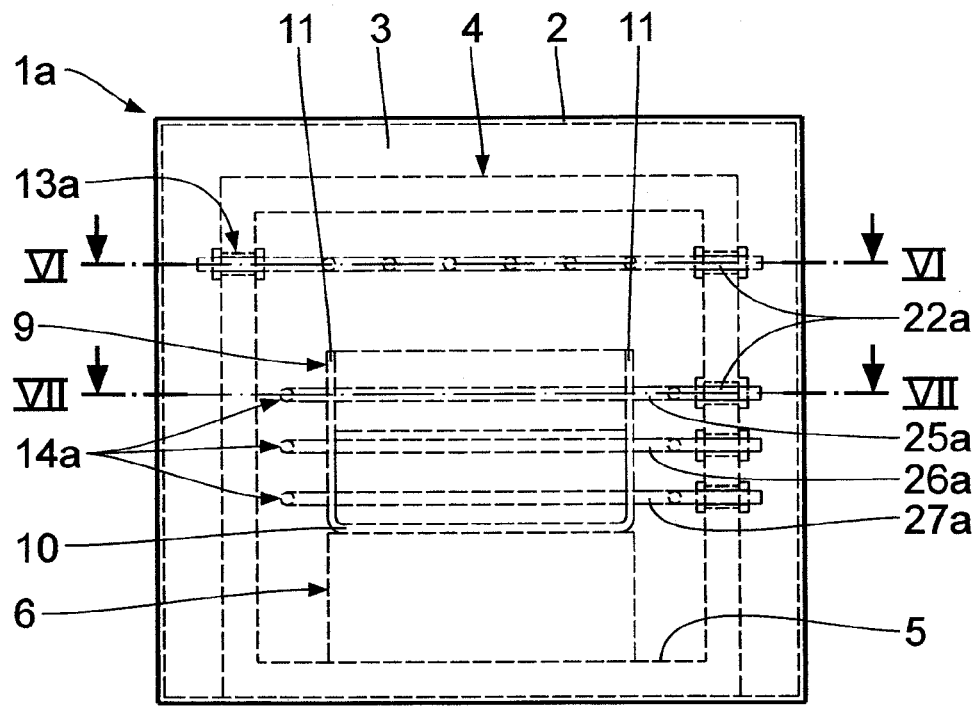
FIG. 5 shows a view of an oven according to a second embodiment.
Figure 6:
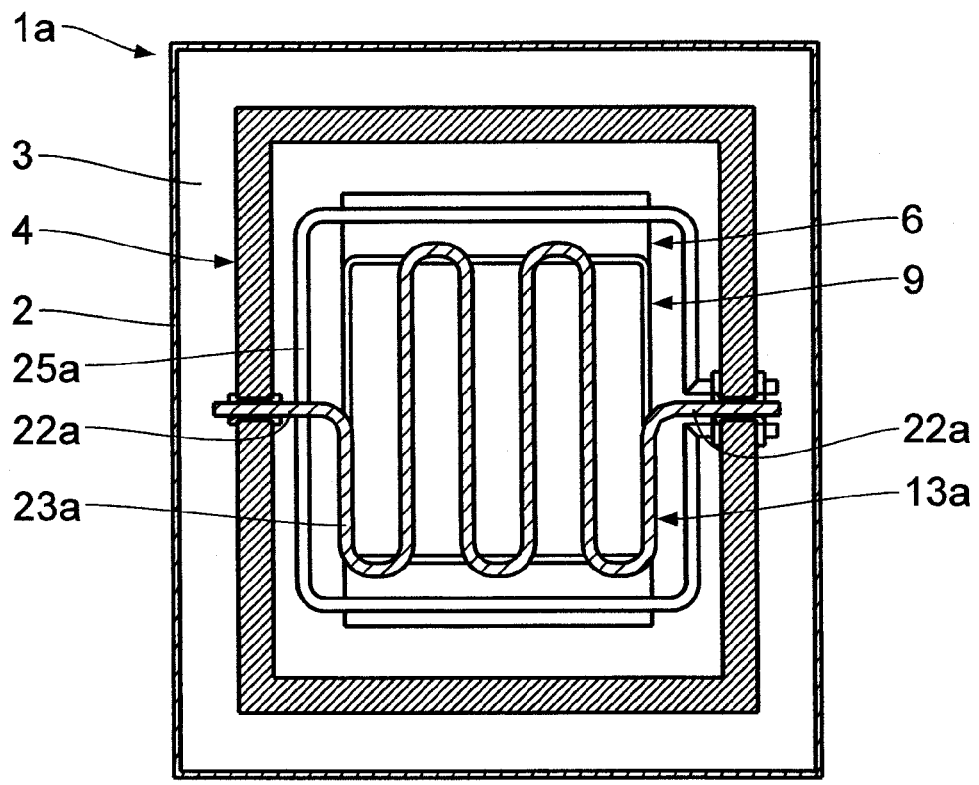
FIG. 6 shows a section according to the line VI-VI in FIG. 5.
Figure 7:
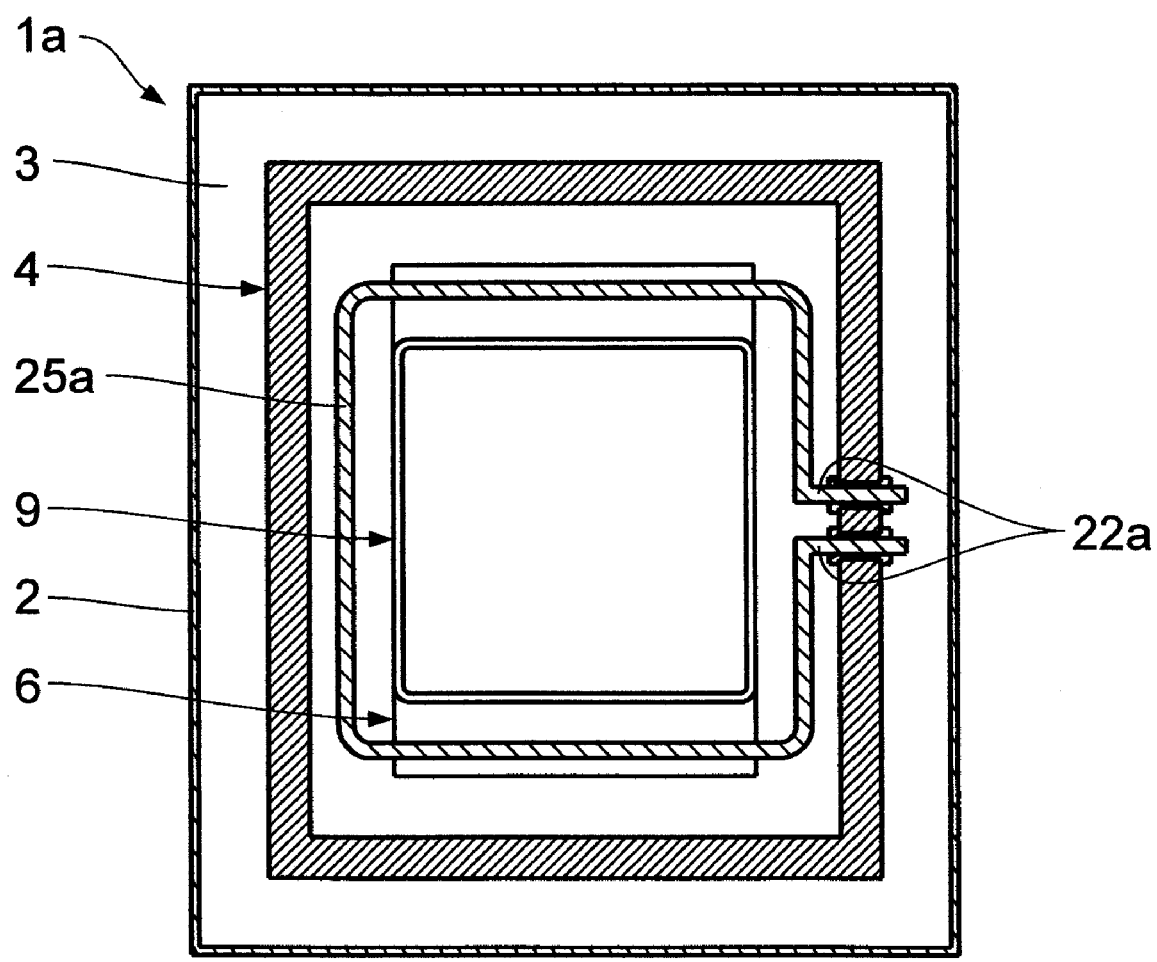
FIG. 7 shows a section according to the line VII-VII in FIG. 5.

A second embodiment of the invention is described below with reference to FIGS. 5 to 7. Identically constructed parts are assigned the same reference symbols as in the first embodiment, to whose description reference is made here. Parts of differing construction but with identical functions are assigned the same reference symbols with an appended a. The substantial difference from the first embodiment lies in the fact that the mould 9 on the circumferential face is encompassed by three superposed loops 25a, 26a, 27a of rectangular cross-section, which are all closed apart from the feed portions 22a and form the side heating device 14a. The floor heating device is not included. Above the mould 9 there is an overhead heating device 13a which consists of a line consisting of a feed portion 22a, a looped portion 23a and an opposing feed portion 22a, the portions 22a being led through the walls of the graphite insulation 4. The loops of the looping portion 23a run horizontally and therefore parallel to the surface of the silicon melt 24. The heating devices 13a, 14a are operated with an alternating current at a frequency of 50 Hz, although other frequencies are also possible. The phase shift of the heating currents, the heating current and the relevant yields are shown in the following table.

| Case | 1 | 2 | 3 | 4 | 5 | 6 |
|---|---|---|---|---|---|---|
| Phase shift of heater current currents | | | | | | |
| Overhead heating device 13a | +120 | −60 | −60 | +120 | +60 | +240 |
| Top line loop 25a | +120 | −60 | +120 | −60 | +240 | +240 |
| Middle line loop 26a | +60 | +60 | +60 | +60 | +120 | +120 |
| Lower line loop 27a | 0 | 0 | 0 | 0 | 0 | 0 |
| Heater current in A | | | | | | |
| Overhead heating device 13a | 700 | 775 | 575 | 700 | 700 | 700 |
| Top line loop 25a | 175 | 150 | 150 | 125 | 125 | 125 |
| Middle line loop 26a | 125 | 225 | 150 | 175 | 125 | 125 |
| Lower line loop 27a | 150 | 325 | 300 | 250 | 250 | 250 |

-continued

| Case | 1 | 2 | 3 | 4 | 5 | 6 |
|---|---|---|---|---|---|---|
| Indication of the yield of good material from the mc-Si blocks (the higher the number the higher the yield) | 3 | 2 | 2 | 1 | 2 | 3 |

It is shown that the highest yield is obtained when a travelling magnetic field, in particular a current with a phase shift of +60° or +120°, is applied to the loops 25a, 26a and 27a and when the overhead heating device 13a is operated in phase with the current in the upper line loop 25a.

Figure 8:
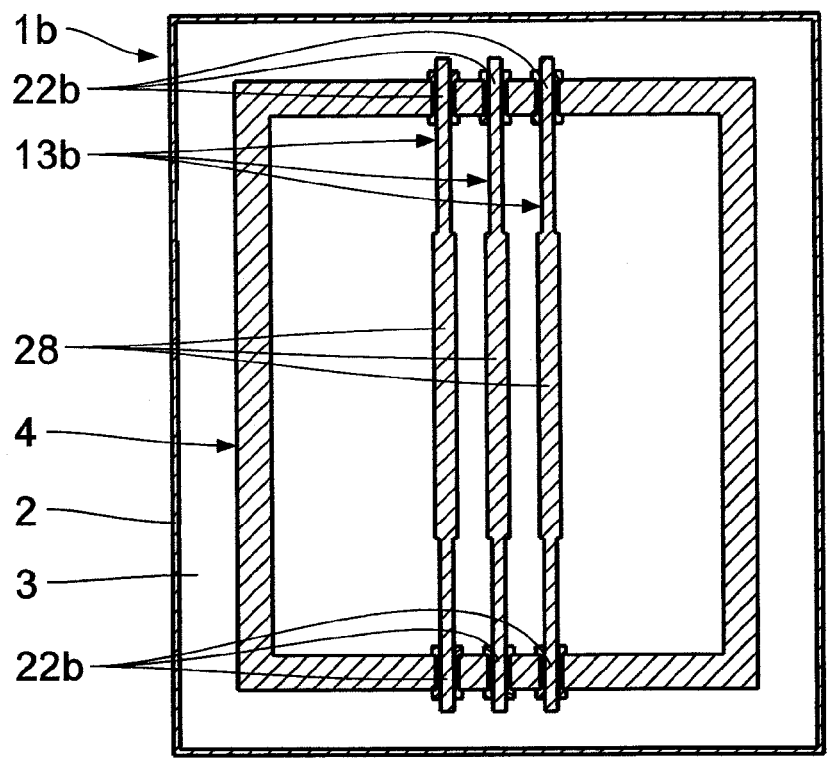
FIG. 8 shows a heating device according to a third embodiment.

Referring to FIG. 8, a third embodiment of the invention is described below. Identical parts are assigned the same reference symbols as in the first embodiment. Parts that are different in construction, but have identical functions are assigned the same reference symbols but with an appended b. By way of example, FIG. 8 shows the structure of one of the heating devices 13b, 14b and/or 15b consisting of three heating rods 28 aligned parallel to one another, which are led through opposing side walls of the graphite insulation 4. The heating rods 28 are preferably supplied with currents which are phase-shifted in such a way as to create a travelling magnetic field. Phase shifts of +60° or +120° are preferable. The arrangement according to FIG. 8 can be disposed at the four side walls 11 of the mould 9 above and/or below it. More than or fewer than three heating rods 28 arranged adjacent to one another may also be used. In addition, the number of heating rods 28 on the various sides of the mould 9 does not have to be identical, on the circumferential face in particular on the one hand as well as, on the other hand, above it and below it.

Figure 9:
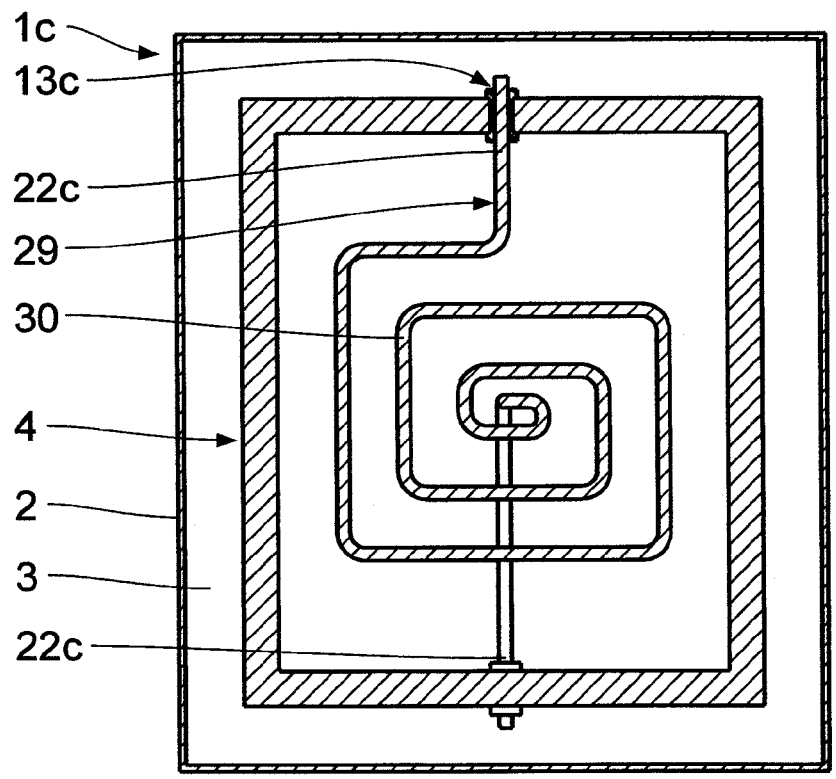
FIG. 9 shows a heating device according to a fourth embodiment.

Referring to FIG. 9, a fourth embodiment of the invention is described below. Identical parts are assigned the same reference symbols as in the first embodiment. Parts that are different in construction, but have identical functions are assigned the same reference symbols but with an appended c. The substantial difference compared with the embodiment according to FIG. 8 is that a spiral heating line 29 consisting of feed portions 22c and a spiral portion 30 is provided. The spiral portion 30 has rectangular sides of reducing lengths which run parallel to the walls of the graphite insulation 4. One of the feed portions 22c is connected to the middle of the spiral and is led behind the spiral portions 30 to the outside. The arrangement shown in FIG. 9 may be disposed on the circumferential faces of the mould 9 and/or above it and/or below it.

Figure 10:
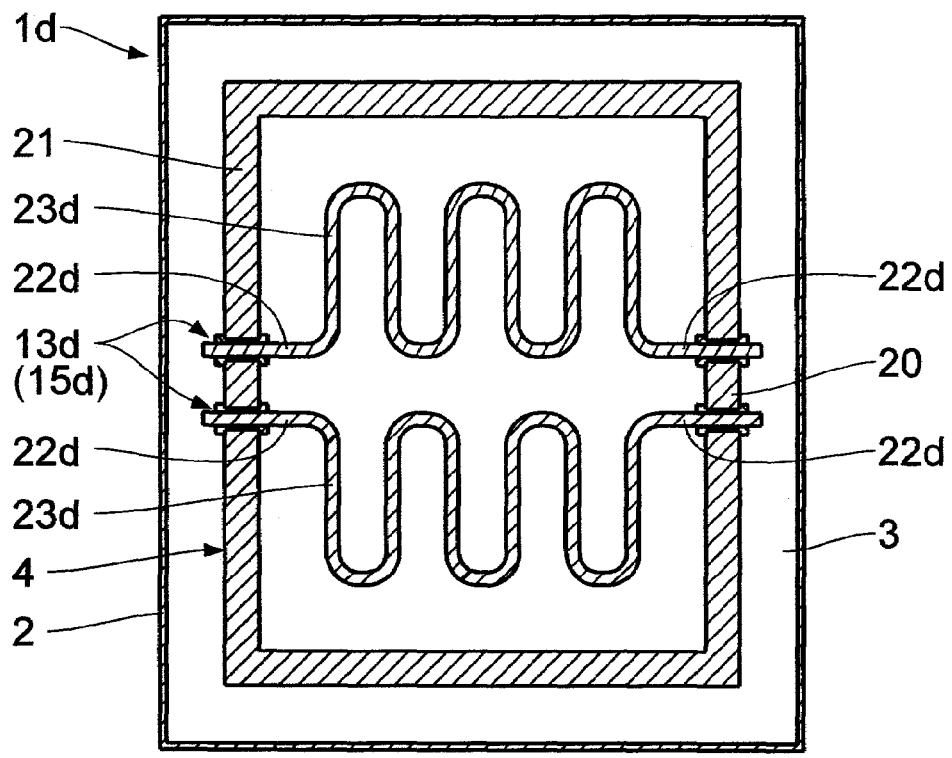
FIG. 10 shows a heating device according to a fifth embodiment.

Referring to FIG. 10, a fifth embodiment of the invention is described below. Identical parts are assigned the same reference symbols as in the first embodiment. Parts that are different in construction, but have identical functions are assigned the same reference symbols but with an appended d. The embodiment according to FIG. 10 shows an overhead and/or side and/or floor heating geometry corresponding to the first embodiment. Also only one looped portion or three looped portions or even more looped portions may be arranged adjacent to one another.

Figure 11:
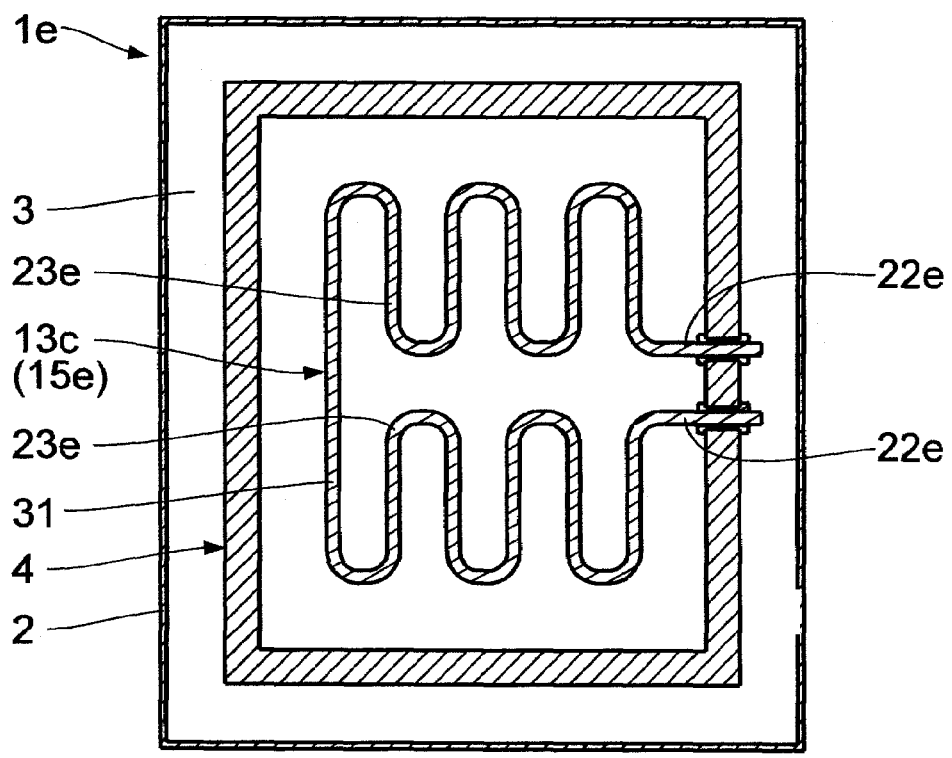
FIG. 11 shows a heating device according to a sixth embodiment.

Referring to FIG. 11, a sixth embodiment of the invention is described below. Identical parts are assigned the same reference symbols as in the first embodiment. Parts that are different in construction, but have identical functions are assigned the same reference symbols but with an appended e. FIG. 11 shows possible floor and/or side and/or overhead heating geometries. The heating line as in FIG. 10 has mutually parallel feed portions 22e to which are connected mirror-symmetrically looped portions 23e which at the end to the left in FIG. 11 are interconnected by means of a connection portion 31. Thus, FIG. 11 forms only one electrical circuit, whereas FIG. 10 forms two electrical circuits.

Figure 12:
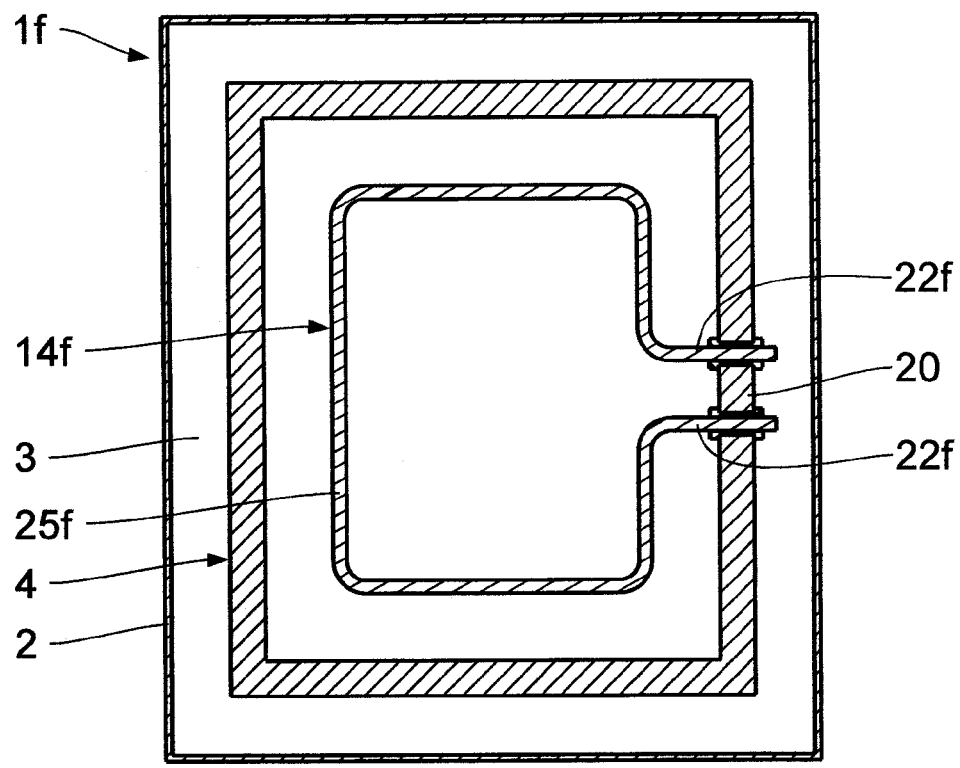
FIG. 12 shows a heating device according to a seventh embodiment.

Referring to FIG. 12, a seventh embodiment of the invention is described below. Identical parts are assigned the same reference symbols as in the first embodiment. Parts that are different in construction, but have identical functions are assigned the same reference symbols but with an appended f. FIG. 12 shows a side heating geometry which has already been described in the second embodiment. Thus, a line loop 25f is provided encompassing the mould 9 with substantially rectangular shape and mutually parallel feed portions 22f.

Figure 13:
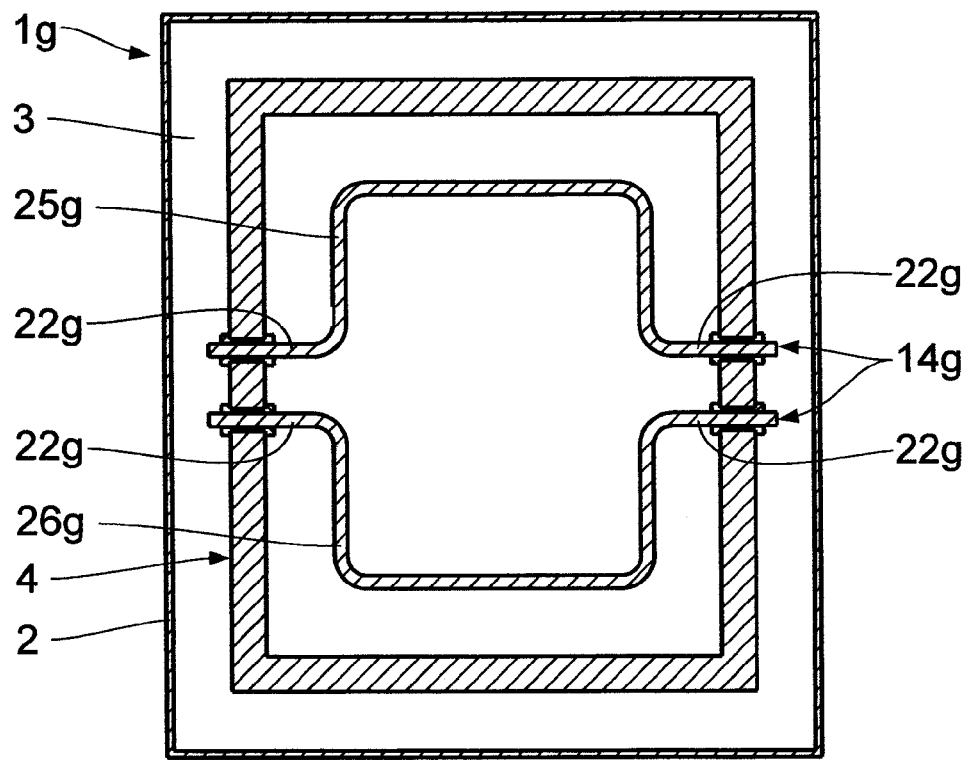
FIG. 13 shows a heating device according to an eighth embodiment.

Referring to FIG. 13, an eighth embodiment of the invention is described below. Identical parts are assigned the same reference symbols as in the first embodiment. Parts that are different in construction, but have identical functions are assigned the same reference symbols but with an appended g. The side heating geometry corresponds substantially to the first embodiment, according to which two lines encompass the mould 9 in a bow shape. Mutually parallel feed portions 22g are provided in each case which merge into rectangular bow-shaped line loops 25g and 26g respectively.

The heating device geometries shown in the previously described embodiments may substantially be combined freely with one another, for example a floor or overhead heating device according to FIG. 11 and a side heating device according to FIG. 12 may be provided. In addition to this, in general floor and overhead heating devices may also differ from one another or, as in the second embodiment, may in part be missing. In addition, several differing heating lines, for example as in FIGS. 12 and 13, may be provided superposed which together form the side heating device.

What is claimed is:

1. An oven for non-metal melting with
   a. a housing (2) enclosing an interior (3),
   b. at least one mould (9) arranged in the interior (3) for receiving a non-metal melt (24),
   c. at least one electrical heating device (12) enclosing at least partially the at least one mould (9) for influencing the temperature of the non-metal melt (24), and
   d. a power supply device (16) coupled in an electrically conductive manner to the at least one heating device (12) for supplying the heating device (12) with a time-variable current I(t), wherein
      i. the current I(t) has a frequency of 0.1 Hz to 1000 Hz and
      ii. the current I(t) is of a magnitude suitable for setting a predetermined temperature of the non-metal melt (24).

2. An oven according to claim 1, wherein the heating device (12) has a side heating device (14; 14a; 14b; 14c; 14f; 14g) enclosing on the circumferential face the at least one mould (9).

3. An oven according to claim 1, wherein the heating device (12) has at least one of an overhead heating device (13; 13a; 13b; 13d; 13e) arranged above the at least one mould (9) and a floor heating device (15; 15d; 15e) arranged below the at least one mould (9).

4. An oven according to claim 1, wherein the current I(t) has a frequency of 1 Hz to 500 Hz.

5. An oven according to claim 1, wherein the current I(t) has a frequency of 10 Hz to 300 Hz.

6. An oven according to claim 1, wherein the current I(t) has a frequency of 75 Hz to 250 Hz.

7. An oven according to claim 1, wherein the current I(t) is composed of a direct current component $I_{DC}$ and an alternating current component $I_{AC}(t)$.

8. An oven according to claim 1, wherein the heating device (12) has a plurality of separate electrical circuits through which phase-shifted current flows.

9. An oven according to claim 8, wherein the heating device (12) has a plurality of separate electrical circuits through which phase-shifted current flows with a phase shift of n·60°, wherein n=1, 2, 3 . . . .

10. An oven according to claim 3, wherein the overhead heating device (13; 13a; 13b; 13d; 13e) has lines looped in shape.

11. An oven according to claim 3, wherein the heating device (12) has at least one spiral line (30).

12. An oven according to claim 7, wherein the direct current component $I_{DC}$ lies at between 0 and 1000 ampere-turns.

13. An oven according to claim 7, wherein the alternating current component $I_{AC}(t)$ lies at 10 to 5000 ampere-turns.

14. An oven according to claim 1, wherein the at least one mould (9) is at least one of rectangular and cuboidal in cross-section.

15. An oven according to claim 1, wherein it is used for the production of polycrystalline silicon.

16. Method for at least one of melting non-metals and solidifying non-metal melts comprising the following steps:
 a) providing an oven according to any one of the preceding claims,
 b) applying a time-variable current I(t),
 c) generating a time-variable magnetic field in the non-metal melt (24).

* * * * *